United States Patent
Chen et al.

(10) Patent No.: US 6,576,530 B1
(45) Date of Patent: Jun. 10, 2003

(54) METHOD OF FABRICATING SHALLOW TRENCH ISOLATION

(75) Inventors: Yi-Nan Chen, Taipei (TW); Chung Peng Hao, Taipei Hsien (TW); Chung-Yuan Lee, Taoyuan (TW)

(73) Assignee: Nanya Technology Corporation, Taoyuan (TW)

( * ) Notice: Subject to any disclaimer, the term of this patent is extended or adjusted under 35 U.S.C. 154(b) by 0 days.

(21) Appl. No.: 10/261,648

(22) Filed: Oct. 1, 2002

(51) Int. Cl.[7] .................. H01L 21/76; H01L 21/31
(52) U.S. Cl. .............. 438/435; 438/437; 438/424; 438/762
(58) Field of Search ................... 438/435, 437, 438/424, 433, 427, 438, 762, 425, 431, 700, 692, 691

(56) References Cited

U.S. PATENT DOCUMENTS

| | | | | | |
|---|---|---|---|---|---|
| 5,010,378 | A | * | 4/1991 | Douglas | 257/301 |
| 5,989,977 | A | * | 11/1999 | Wu | 438/431 |
| 6,001,706 | A | * | 12/1999 | Tan et al. | 438/424 |
| 6,146,974 | A | | 11/2000 | Liu et al. | |
| 6,150,237 | A | * | 11/2000 | Lee | 438/433 |
| 6,165,854 | A | * | 12/2000 | Wu | 438/296 |
| 6,251,748 | B1 | * | 6/2001 | Tsai | 438/425 |
| 6,261,921 | B1 | * | 7/2001 | Yen et al. | 438/424 |
| 6,274,483 | B1 | * | 8/2001 | Chang et al. | 438/640 |
| 6,368,941 | B1 | * | 4/2002 | Chen et al. | 438/424 |
| 6,426,272 | B1 | * | 7/2002 | Fu et al. | 438/435 |
| 6,440,816 | B1 | * | 8/2002 | Farrow et al. | 438/401 |
| 6,461,937 | B1 | * | 10/2002 | Kim et al. | 438/431 |
| 6,509,271 | B1 | * | 1/2003 | Kobayashi | 438/692 |
| 6,518,148 | B1 | * | 2/2003 | Cheng et al. | 438/437 |
| 2001/0012675 | A1 | * | 8/2001 | Wu | 438/435 |
| 2001/0026979 | A1 | * | 10/2001 | Chern | 438/289 |
| 2002/0053715 | A1 | * | 5/2002 | Kim et al. | 257/524 |
| 2002/0137305 | A1 | * | 9/2002 | Lin et al. | 438/424 |
| 2002/0168850 | A1 | * | 11/2002 | Kim | 438/637 |

* cited by examiner

Primary Examiner—Michael S. Lebentritt
(74) Attorney, Agent, or Firm—Nelson A. Quintero

(57) ABSTRACT

A method of fabricating shallow trench isolation. A liner silicon nitride layer and a liner silicon oxide layer are used as a hard mask to etch a semiconductor substrate, forming a shallow trench. Then, after forming a thermal oxide film on the inner wall of the shallow trench, a silicon rich oxide is formed using HDPCVD with no bias application. A silicon oxide layer is then formed to fill the shallow trench using HDPCVD with bias application.

10 Claims, 5 Drawing Sheets

METHOD OF FABRICATING SHALLOW TRENCH ISOLATION

BACKGROUND OF THE INVENTION

1. Field of the Invention

The invention relates to integrated circuit fabrication technology and, in particular, to a method of fabricating STI (shallow trench isolation) that can prevent corner erosion of the STI, thus improving the performance of a semiconductor device.

2. Description of the Related Art

Formed by filling insulating materials, such as silicon oxide ($SiO_2$), into the trench in the semiconductor substrate using HDPCVD (high-density plasma-chemical vapor deposition), the STI (shallow trench isolation) has gradually taken the place of conventional LOCOS (Local-Oxidation of Silicon).

Since HDPCVD has the advantage of good gap-filling capability, insulating materials filling the trench can be planarized. However, due to the effect of plasma during the trench-filling process, accompanying processes such as bombardment etching, sputtering, and deposition may damage the exposed semiconductor substrate. To solve this problem, a shallow trench isolation manufacturing method has been proposed. For instance, U.S. Pat. No. 6,146,974 for "Method of fabricating shallow trench isolation (STI)" discloses a method of fabricating STI, in which a first HDPCVD is performed to form a conformal oxide layer on the liner oxide layer without applying bias to the substrate. Then, a second HDPCVD is performed on the conformal oxide layer to form an oxide layer that fills the trench and covers the conformal oxide layer. After the second HDPCVD step, CMP (chemical mechanical polishing) is performed to planarize the oxide layer.

However, to remove silicon oxide formed by natural oxidation from the hard mask, before peeling the hard mask including silicon nitride, HF etchant performs deglazing. Section views FIG. 1 to FIG. 3 are referenced hereinbelow to explain the fabrication process of the shallow trench isolation in the related art.

As shown in FIG. 1, a hard mask HM constituting a liner silicon nitride layer 14 and a liner silicon oxide layer 12 is used to etch a semiconductor substrate 10 to form a trench 16. 18 is a thermal oxide film formed by thermal oxidation, 20 is a liner nitride film, and 22 is the silicon oxide layer formed by HDPCVD (no bias application) with the flow ratio of $O_2$ to $SiH_4$ being about 2~4:1. 24 is the trench-filling silicon oxide layer formed by HDPCVD (with bias application) with the flow ratio of $O_2$ to $SiH_4$ being about 2~4:1. The upper surface of the silicon oxide layer 22 is lower than the trench-filling silicon oxide layer 24. This is because during deglazing, the etching rate of the silicon oxide layer 22 (for example, about 690 angstroms per minute) is higher than that of the trench-filling silicon oxide layer 24 (for example, about 300 angstroms per minute). A recess 25 is formed between the liner nitride film 20 and the trench-filling silicon oxide layer 24, and is stopped at the corner of the liner nitride film 20.

As shown in FIG. 2, etchants such as phosphoric acid are used to remove the liner silicon nitride layer 14 from the hard mask HM. The liner nitride film 20 is etched to form a small channel 26, and leaves a portion 20a.

As shown in FIG. 3, etchants such as HF acid are used to remove the liner silicon oxide layer 12 of the hard mask HM. At this time, enchants etch the thermal oxide film 18 via the small channel 26. Thus, a recess 28 is formed at the corner of the shallow trench isolation, and the oxide denoted by reference number 18a is left. This affects the performance of the MOS transistors subsequently formed.

SUMMARY OF THE INVENTION

In view of the above, an objective of the invention is to provide a method of fabricating a shallow trench isolation, which can avoid the formation of recesses at the corner of the shallow trench, thus enhancing the performance of the subsequently formed MOS.

To achieve this objective, the method of fabricating a shallow trench isolation according to the invention includes the following steps.

A semiconductor substrate is provided, a liner silicon oxide layer is formed thereon, and a liner silicon nitride layer is formed on the liner silicon oxide layer. Then, the liner silicon nitride layer and the liner silicon oxide layer are used as a hard mask to etch a semiconductor substrate to form a shallow trench.

Then, after a thermal oxide film is formed on the inner wall of the shallow trench, a silicon rich oxide layer covering the surface of the thermal oxide film is formed by HDPCVD (high density plasma-chemical vapor deposition) with no bias application. The thickness of the silicon rich oxide may be about 50~150 angstrom. $SiH_4$ and $O_2$ may be used as reaction gases, and the ratio of the flow rate of $O_2$ to $SiH_4$ may be about 1:1 to 1:2.

A silicon oxide layer filling the shallow trench is then formed by HDPCVD with bias application. $SiH_4$ and $O_2$ may be used as reaction gases, and the ratio of the flow rate of $O_2$ and $SiH_4$ may be about 1:1 to 1:2.

The layers above the hard mask are then removed for planarization by CMP with the liner silicon nitride layer as a stop layer. Then, deglazing is performed to remove a portion of the silicon oxide layer, a portion of the silicon rich oxide, and a portion of the thermal oxide film.

After removing the liner silicon nitride layer to expose the liner silicon oxide layer, the liner silicon oxide layer, a portion of the silicon rich oxide, a portion of the thermal oxide layer, and a portion of the silicon oxide layer are removed to expose the semiconductor substrate. Then, a sacrifice oxide film is formed on the surface of the semiconductor substrate to avoid the corner erosion of the shallow trench isolation. The sacrifice oxide film may be formed by thermal oxidation, and may have a thickness about 50~100 angstrom. A portion of the sacrifice oxide film is then removed using HF as the etchant, and a portion of the silicon rich oxide is reserved to avoid the corner erosion of the shallow trench isolation.

DETAILED DESCRIPTION OF THE INVENTION

The fabrication process of the shallow trench isolation according to an embodiment of the invention will be described with reference to sectional views shown in FIG. 4 to FIG. 10.

Figure 1:
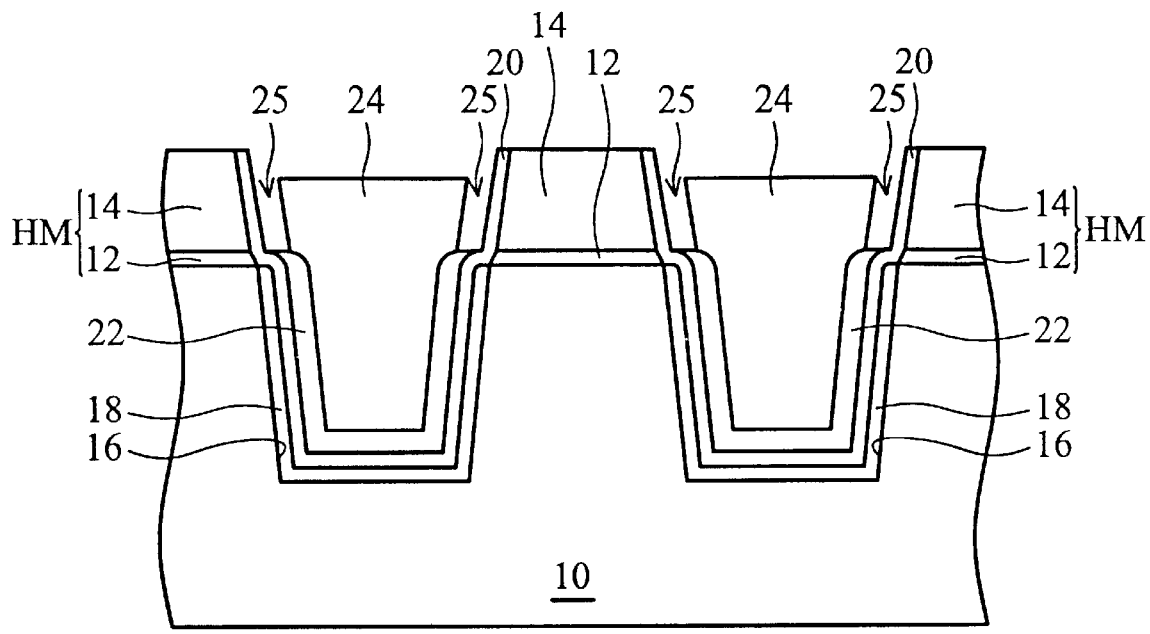
FIGS. 1 to 3 are sectional views showing the fabrication process of the shallow trench isolation in the prior art
Figure 2:
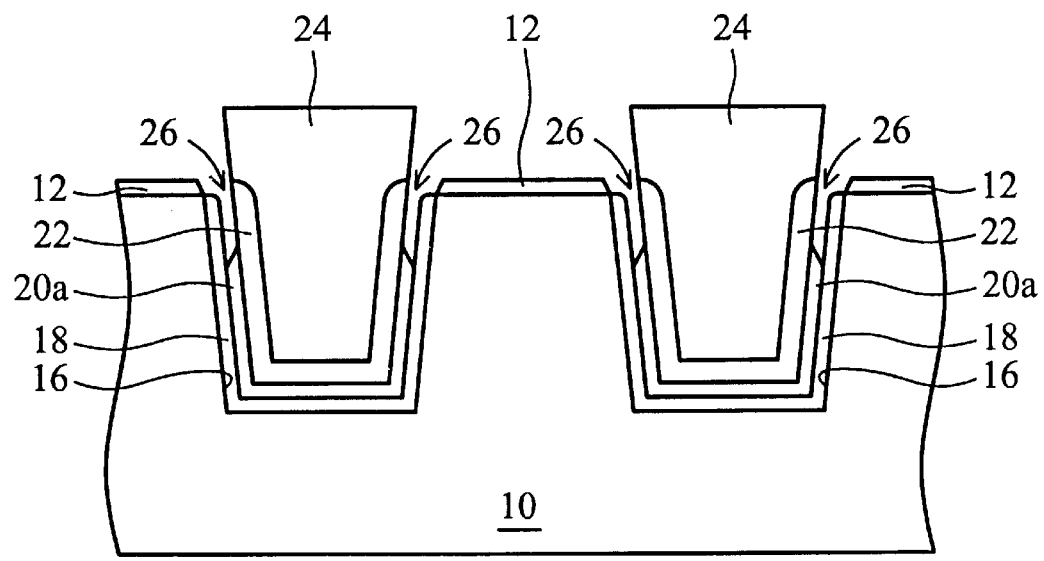
Figure 3:
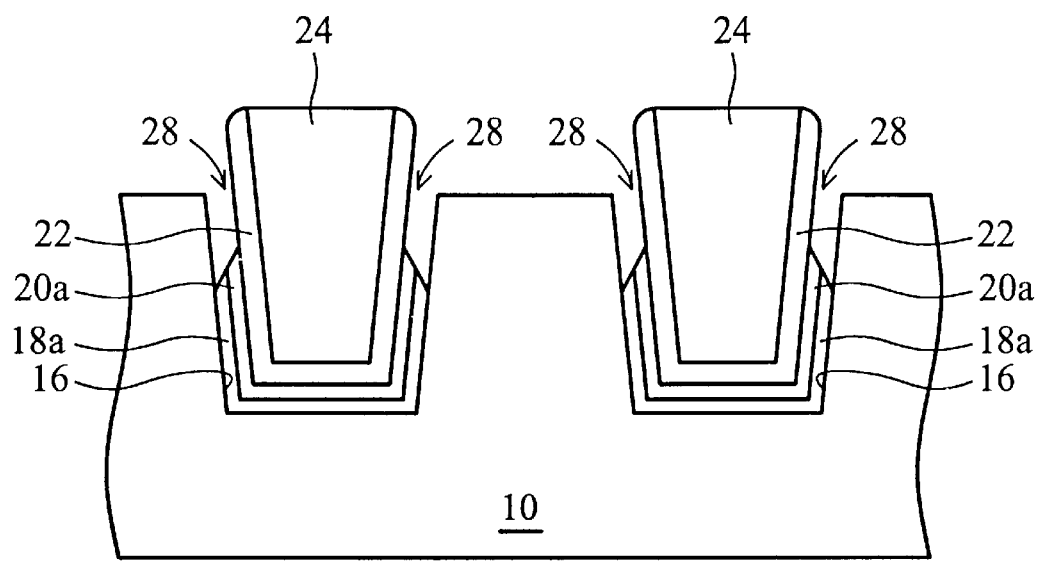
Figure 4:
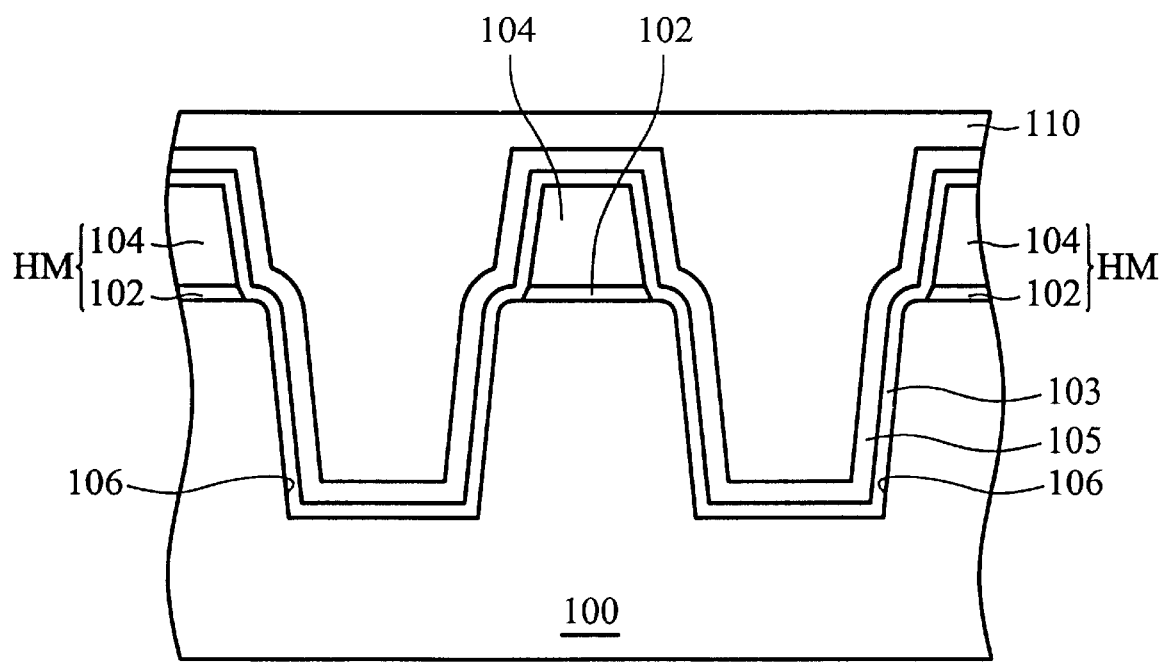
FIGS. 4 to 10 are sectional views showing the fabrication process of the shallow trench isolation according to the embodiments of the invention.

Refer to FIG. 4. An anisotropic etching is performed to form a shallow trench 106 in a semiconductor substrate 100 using the hard mask HM including a liner silicon oxide layer 102 and a liner silicon nitride layer 104 as a shield. Then, a thermal oxide film 103 having a thickness of about 100~200 angstroms is formed on the surface of the shallow trench 106 by thermal oxidation. A no-bias-applied HDPCVD process with a flow ratio of $O_2$ to $SiH_4$ of about 1:1 to 1:2 is then performed to form a silicon rich oxide 105 on the surface of the thermal oxide film 103. The thickness of the silicon rich oxide 105 is about 50~150 angstrom, and the etching rate thereof is about 100~200 angstroms per minute. Then, HDPCVD continues with bias application with a flow ratio of $O_2$ to $SiH_4$ of about 1:2 to form a trench-filling silicon oxide layer 110 on the surface of the silicon rich oxide 105. The etching rate of the silicon oxide layer 110 in a 5% HF etchant is about 450~500 angstroms per minute.

Figure 5:
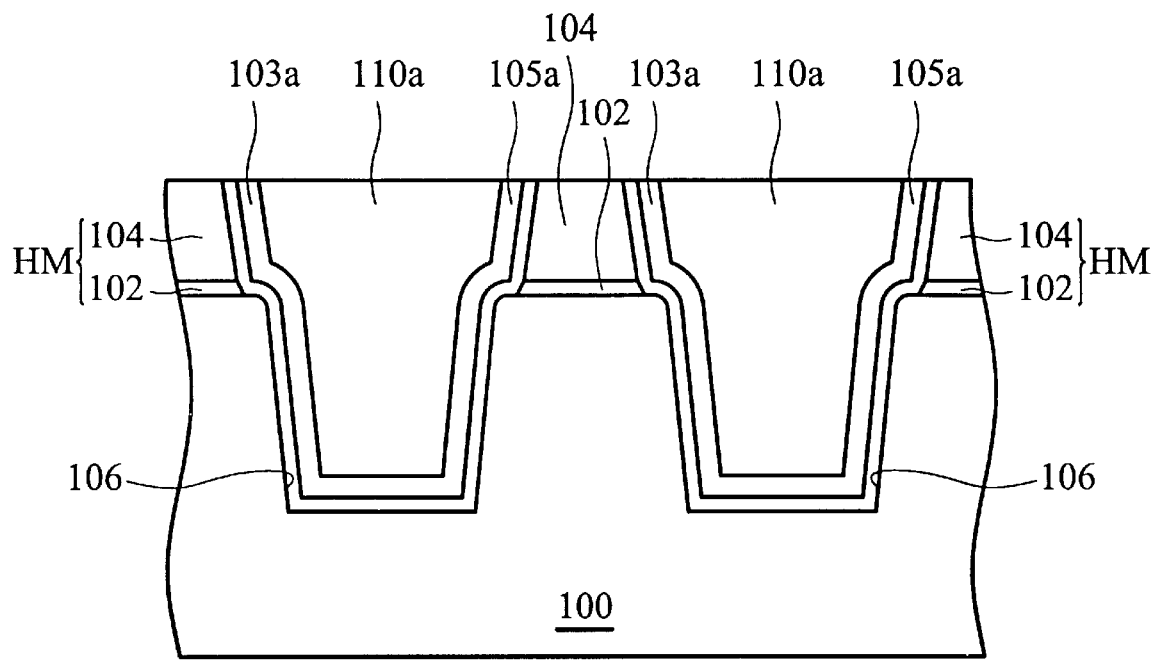

As shown in FIG. 5, by a CMP process using the liner silicon nitride 104 as a stop layer, the layers above the hard mask HM are then removed except for the silicon oxide layer 110a, the silicon rich oxide 105a, and the thermal oxide film 103a.

Figure 6:
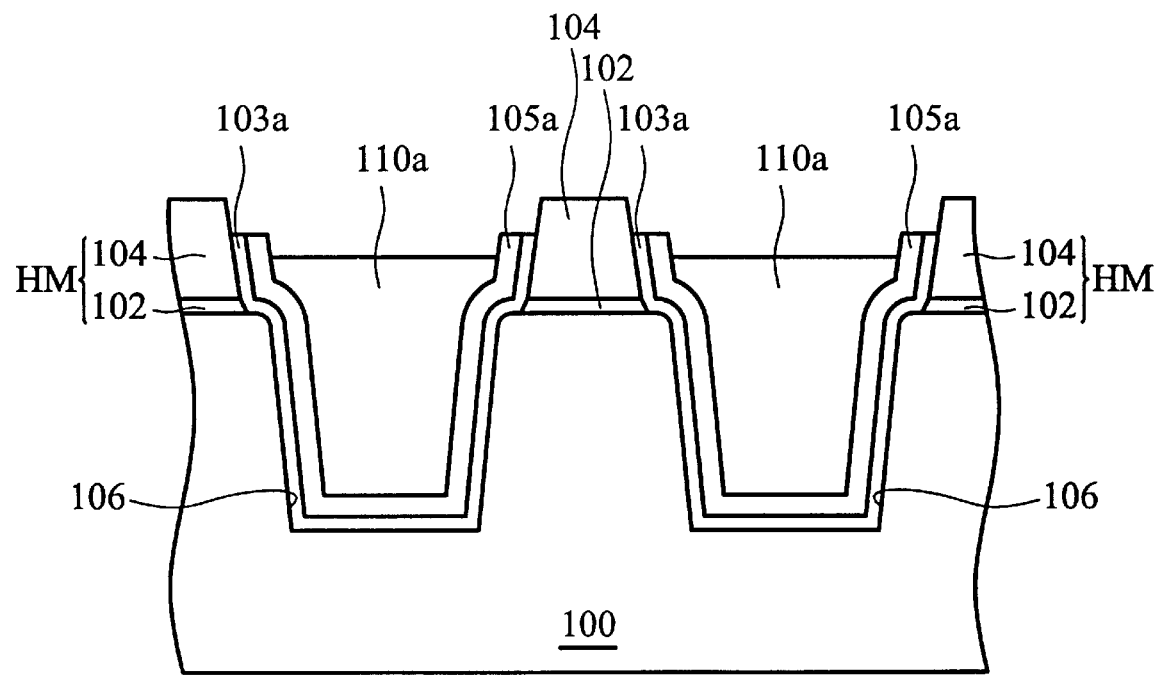

Refer to FIG. 6. Deglazing removing portions of the silicon oxide layer 110a, the silicon rich oxide 105a, and the thermal oxide film 103a is then performed to form a silicon oxide layer 110b, a silicon rich oxide 105b, and a thermal oxide film 103b. Since the ratio of the etching rates of the silicon oxide layer 110a and the silicon rich oxide 105a is about 1.5~3:1, the top surface of the silicon rich oxide 105b is higher than that of the silicon oxide layer 110b, as the structure shown in FIG. 6.

Figure 7:
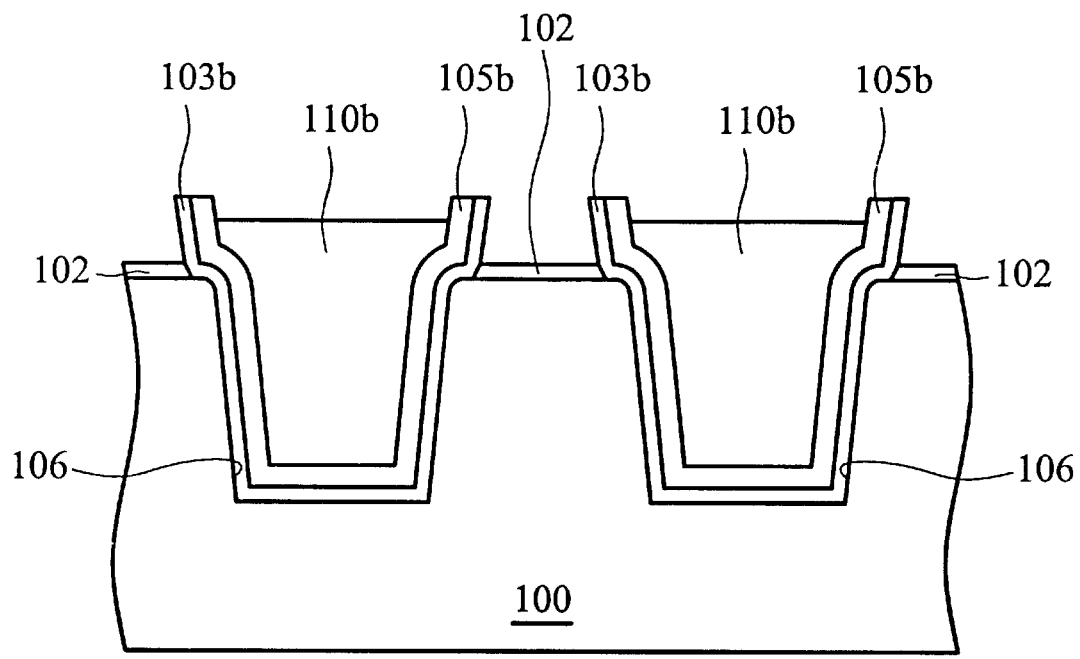

As shown in FIG. 7, the liner silicon nitride layer 104 of the hard mask HM is then removed to expose the liner silicon oxide layer 102.

Figure 8:
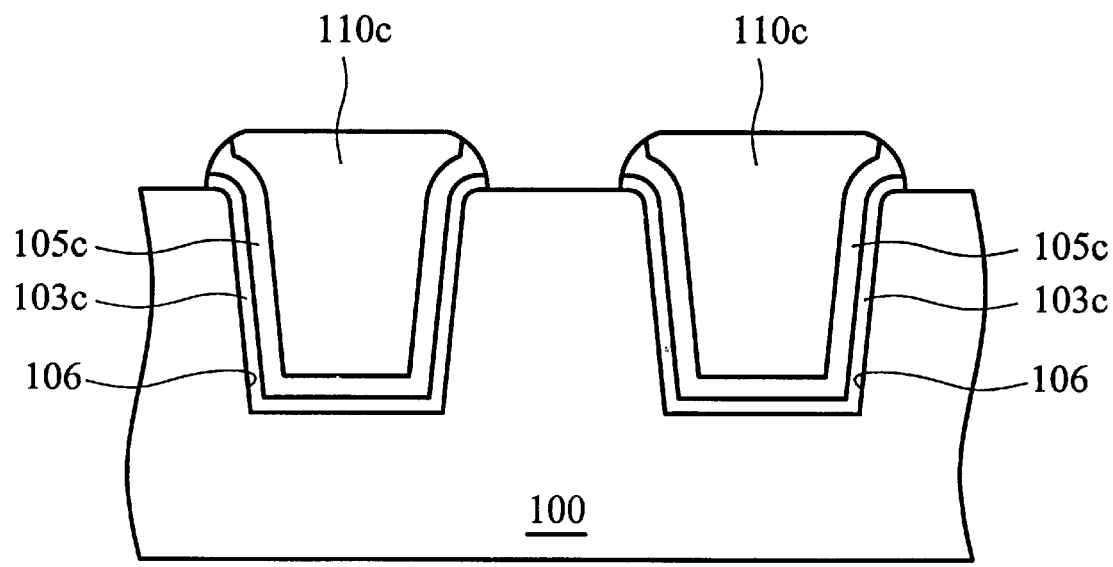

As shown in FIG. 8, the liner silicon oxide layer 102 is then removed. Portions of the silicon rich oxide 105b, the thermal oxide film 103b, and the silicon oxide layer 110b are also removed to form a silicon rich oxide 105c, a thermal oxide film 103c, and the silicon oxide layer 110c. The semiconductor substrate 100 is thus exposed.

Figure 9:
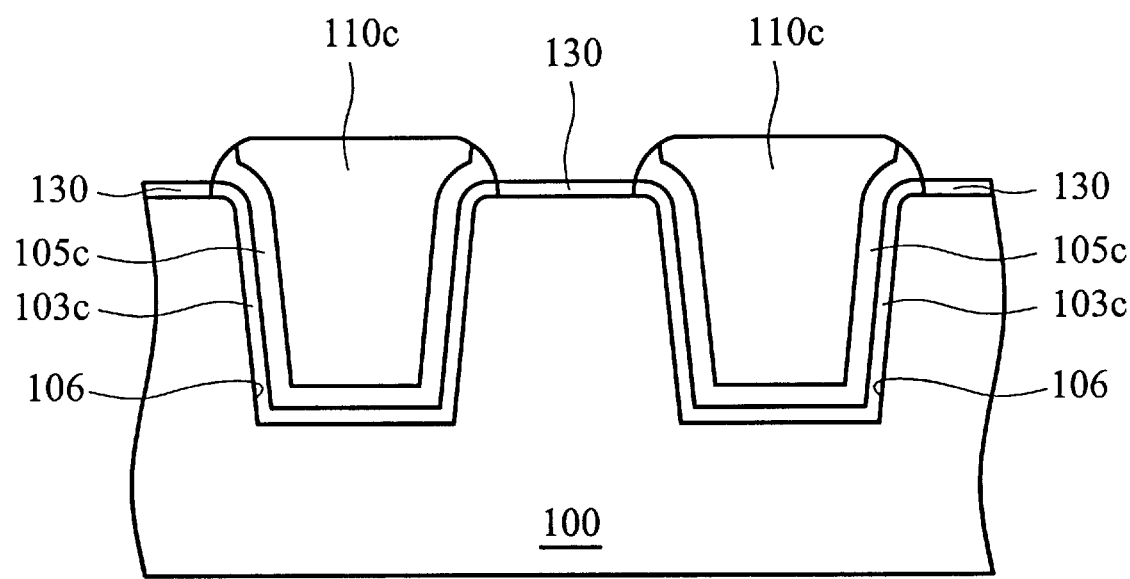

As shown in FIG. 9, a thermal oxidation process is then performed to form a sacrifice oxide film having a thickness about 50~150 angstroms on the surface of the semiconductor substrate 100.

Figure 10:
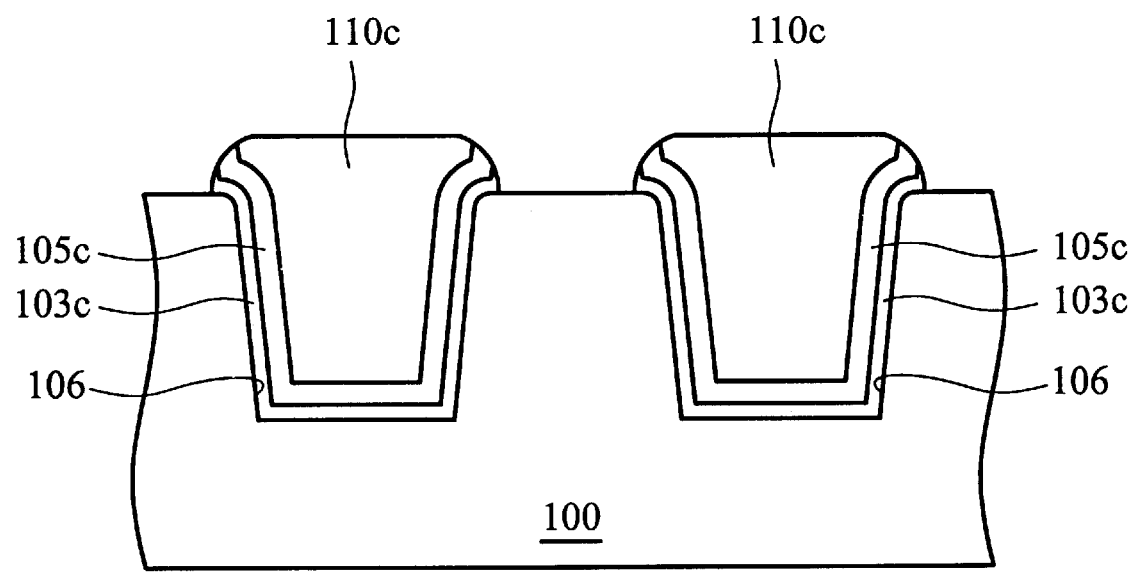

As shown in FIG. 10, part of the sacrifice oxide film 130 is then removed to complete the fabrication process of the shallow trench isolation.

One characteristic of the invention is that by adjusting the reaction gases, the silicon rich oxide is formed by HDPCVD with no bias application. The trench-filling silicon oxide layer is then formed by HDPCVD continuously with bias application.

The fabrication process according to the invention can avoid the formation of the recess at the corner of the shallow trench isolation, thus improving the performance of the subsequently formed MOS.

While the invention has been described with reference to a preferred embodiment, this description is not intended to be construed in a limiting sense. Various modifications of the embodiment will be apparent to persons skilled in the art upon reference to the description. It is therefore intended that the appended claims encompass any such modifications.

What is claimed is:

1. A method of fabricating a shallow trench isolation on a semiconductor substrate, comprising:

providing a semiconductor substrate;

forming a liner silicon oxide layer on the semiconductor substrate;

forming a liner silicon nitride layer on the liner silicon oxide layer;

defining the liner silicon nitride layer and the liner silicon oxide layer;

defining the semiconductor substrate to form a shallow trench using the liner silicon nitride layer and the liner silicon oxide layer as a hard mask;

forming a thermal oxide film on the inner wall of the shallow trench;

forming a silicon rich oxide layer covering the surface of the thermal oxide film by HDPCVD (high density plasma-chemical vapor deposition) with no bias application;

forming a silicon oxide layer to fill the shallow trench by HDPCVD with bias application;

removing the layers above the hard mask except for the portions in the shallow trench;

removing a portion of the silicon oxide layer, a portion of the silicon rich oxide, and a portion of the thermal oxide film, wherein the silicon oxide layer is lower than the silicon rich oxide;

removing the liner silicon nitride layer to expose the liner silicon oxide layer;

removing the liner silicon oxide layer, a portion of the silicon rich oxide, a portion of the thermal oxide layer, and a portion of the silicon oxide layer to expose the semiconductor substrate;

forming a sacrifice oxide film on the surface of the semiconductor substrate; and removing a portion of the sacrifice oxide film.

2. The method of fabricating a shallow trench isolation according to claim 1, wherein the step of forming the silicon rich oxide is accomplished using $SiH_4$ and $O_2$ as reaction gases.

3. The method of fabricating a shallow trench isolation according to claim 2, wherein the ratio of the flow rate of $SiH_4$ and $O_2$ is about 1:1 to 1:2.

4. The method of fabricating a shallow trench isolation according to claim 1, wherein the thickness of the silicon rich oxide is about 50~150 angstrom.

5. The method of fabricating a shallow trench isolation according to claim 1, wherein the step of forming the silicon rich oxide is accomplished using $SiH_4$ and $O_2$ as reaction gases.

6. The method of fabricating a shallow trench isolation according to claim 5, wherein the ratio of the flow rate of $O_2$ and $SiH_4$ is about 1:1 to 1:2.

7. The method of fabricating a shallow trench isolation according to claim 1, wherein the step of removing the layers above the hard mask is accomplished using the liner silicon nitride layer as a stop layer and performing a CMP (chemical mechanical polishing) process.

8. The method of fabricating a shallow trench isolation according to claim 1, wherein the step of forming the sacrifice oxide film is accomplished by thermal oxidation.

9. The method of fabricating a shallow trench isolation according to claim 1, wherein the thickness of the sacrifice oxide film is about 50~100 angstrom.

10. The method of fabricating a shallow trench isolation according to claim 1, wherein the step of removing the sacrifice oxide film is accomplished using HF etchant.

* * * * *